United States Patent [19]

Naka et al.

[11] Patent Number: 4,968,987

[45] Date of Patent: Nov. 6, 1990

[54] DELTA-SIGMA MODULATION ANALOG TO DIGITAL CONVERTER

[75] Inventors: Hideyuki Naka; Kazuo Konishi, both of Kanagawa, Japan

[73] Assignee: Kabushiki Kaisha Toshiba, Kanagawa, Japan

[21] Appl. No.: 347,697

[22] Filed: May 5, 1989

[30] Foreign Application Priority Data

May 13, 1988 [JP] Japan ............................... 63-117347

[51] Int. Cl.$^5$ ................................ H03M 3/02
[52] U.S. Cl. .................... 341/143; 341/155; 375/28
[58] Field of Search ............... 341/131, 110, 143, 155, 341/166; 375/26, 27, 28, 33

[56] References Cited

U.S. PATENT DOCUMENTS

| 4,509,037 | 4/1985 | Harris | 341/143 |
| 4,746,899 | 5/1988 | Swanson et al. | 341/122 |
| 4,851,841 | 7/1989 | Sooch | 341/143 |

Primary Examiner—William M. Shoop, Jr.
Assistant Examiner—Brian K. Young
Attorney, Agent, or Firm—Finnegan, Henderson, Farabow, Garrett, and Dunner

[57] ABSTRACT

A delta-sigma modulation analog to digital converter for converting an analog input signal to a digital output signal. The converter includes a clock generator for generating a very high frequency clock signal, a dither signal generator responsive to the clock signal generator for generating a dither signal which is synchronized with the clock signal, an adder coupled to the dither signal generator for combining the analog input signal and the dither signal, a delta-sigma modulation type quantizer coupled to the adder for quantizing the analog input signal and the dither signal in response to the clock signal and a data decimation circuit responsive to the clock signal and coupled to the delta-sigma modulation type quantizer for decimation prescribed quantization data from the quantized signal and producing a digital signal corresponding to the analog input signal.

8 Claims, 4 Drawing Sheets

DELTA-SIGMA MODULATION ANALOG TO DIGITAL CONVERTER

FIELD OF THE INVENTION

The present invention relates generally to an analog to digital converter, and more particularly, to a delta-sigma modulation analog to digital converter.

BACKGROUND OF THE INVENTION

Conventionally, an analog to digital converter (referred as A/D converter hereafter) is used in many fields. In particular, an A/D converter having a delta-sigma modulation type quantizer (referred to as Δ-Σ modulation type quantizer hereafter) is widely used, because the Δ-Σ modulation type quantizer has excellent aspects for reducing quantization noise, making a circuit into a Large Scale Integration (LSI) circuit or increasing the operational speed of circuits. Such an A/D converter with the Δ-Σ modulation type quantizer will be referred to as Δ-Σ modulation A/D converter hereafter.

Referring now to FIGS. 1 and 2, two examples of conventional Δ-Σ modulation A/D converters will be described. One example of the Δ-Σ modulation A/D converter has a typical construction of Δ-Σ modulation type quantizers. Another example of the Δ-Σ modulation A/D converter has an improved construction of the Δ-Σ modulation type quantizers, as described later.

FIG. 1 shows a block diagram of the former conventional Δ-Σ modulation A/D converter. This conventional Δ-Σ modulation A/D converter comprises a Δ-Σ modulation type quantizer 10 and a decimation filter 12. The Δ-Σ modulation type quantizer 10 is constructed in, for example, a double-integration quantizer configuration. In such a double-integration quantizer configuration, the Δ-Σ modulation type quantizer 10 comprises first and second adders 14 and 16. First and second integrators 18 and 20 and a quantizer 22. The first adder 14 is coupled to an input circuit 24 for receiving an analog input signal Sa to be digitalized. The quantizer 22 is coupled to an output circuit 26 through the decimation filter 12.

The first adder 14 combines the analog input signal Sa and a signal Sb. The signal Sb is fed back from the quantizer 22, as described later. The analog input signal Sa is applied to a non-inverse phase input terminal of the first adder 14. On the other hand, the feedback signal Sb is applied to its inversed phase input terminal. Thus, the feedback signal Sb is fed back in the well-known negative phase configuration.

A signal Sc output from the first adder 14 is applied to the frist integrator 18. The first integrator 18 integrates the signal Sc obtained from the first adder 14. A first integrated signal Sd output from the first integrator 18 is applied to the second adder 16. The second adder 16 combines the first integrated signal Sd and again the feedback signal Sb. The first integrated signal Sd is applied to a non-inverse phase input terminal of the second adder 16. On the other hand, the feedback signal Sb is applied to its inverse phase input terminal. Thus, the feedback signal Sb is fed back in the negative phase configuration.

A signal Se output from the second adder 16 is then applied to the second integrator 20. The second integrator 20 integrates the signal Se obtained from the second adder 16. A second integrated signal Sf output from the second integrator 20 is applied to the quantizer 22. The quantizer 22 carries out a quantization operation for the second integrated signal Sf.

The quantization operation by the quantizer 22 is carried out as follows. The quantizer 22 compares the second integrated signal Sf with a prescribed reference potential in every cycle of a clock signal CK. The clock signal CK is generated by a clock signal generator 28. The clock signal generator 28 generates the clock signal CK with a prescribed stable frequency Fc. The clock signal CK is supplied to the quantizer 22 as a sampling signal. The clock signal CK is further supplied to the decimation filter 12, as described later. The frequency Fc of the clock signal CK is set to a frequency sufficiently higher than the highest frequency component of the analog input signal Sa. Thus, the second integrated signal Se output from the second integrator 20 is sampled at a rate of the frequency Fc of the clock signal CK in the quantizer 22. Thus, a quantized signal Sg is output from the quantizer 22.

The quantized signal Sg obtained by the quantizer 22 is fed back to the first and second adders 14 and 16. Thus, the feedback signal Sb coincides with the quantized signal Sg output from the quantizer 22. the quantized signal Sg is integrated, re-sampled and again integrated to reduce quantizing noises occuring in the quantization operation by the quantizer 22 so that the quantization quality of the quantized signal Sg is increased. The quantized signal Sg output from the Δ-Σ modulation type quantizer 10 is applied to the decimation filter 12. The decimation filter 12 thins out prescribed quantization data from the quantized signal Sg so that a digital signal Sh corresponding to the analog input signal Sa is obtained through the output circuit 26. The data decimation operation of the decimation filter 12 is carried out under the control of the clock signal CK supplied from the clock signal generator 28.

The former conventional Δ-Σ modulation A/D converter having such a typical Δ-Σ modulation type quantizer can carry out and A/D conversion with good quantizing accuracy and good quantizint noise reduction characteristic by a simple construction. However, recently reduction of quantizing noises to a greater degree has been desired. Thus, an improvement of the Δ-Σ modulation type quantizer has been made by applying a dither signal to the analog input signal. Such an improved Δ-Σ modulation type quantizer appears in the article "A 16-bit Oversampling A-to-D Conversion Technology Using Triple-Integration Noise Shaping", on pp. 921-929 of "IEEE Journal of Solid-State Circuits", Vol. SC-22, No. 6.

FIG. 2 shows a block diagram of the latter conventional A/D converter having such an improved Δ-Σ modulation type quantizer. This conventional Δ-Σ modulation A/D converter basically comprises a Δ-Σ modulation type quantizer similar to the circuit of FIG. 8 in the article. In the following explanation of FIG. 2, reference numerals or letters used in FIG. 1 will be used to designate like or equivalent elements for simplicity of explanation.

As shown in FIG. 2, this latter conventional Δ-Σ modulation A/D converter comprises third, fourth and fifth adders 30, 32 and 34, a dither signal generator 36, first and second Δ-Σ modulation type quantizer 10a and 10b, an overflow prevention filter 38, a decimation filter 12 and a clock signal generation 28. Each block of the first and second Δ-Σ modulation type quantizer 10a and 10b has a typical construction similar to the Δ-Σ modulation type quantizer 10 of FIG. 1. The decimation filter 12 corresponds to the decimation filter 12 of FIG. 1. The clock signal generator 28 supplies a clock signal CK to the first and second Δ-Σ modulaton type quantizer 10a and 10b and the decimation filter 12 as a sampling signal. The clock signal generator 28 further supplies the clock signal CK to the decimation filter 12.

In FIG. 2, the third and fourth adders 30 and 32 are parallelly coupled to an input circuit 24 for receiving an analog input signal Sa to be digitalized. The third and fourth adders 30 and 32 are further coupled to the dither signal generator 36 for receiving a dither signal Si. Generally, a frequency of the dither signal Si is selected to a higher frequency separated from the frequency band of the analog input signal Sa. The analog input signal Sa and the ditcher signal Si are applied to the first and second Δ-Σ modulation type quantizers 10a and 10b through the third and fourth adders 30 and 32, respectively. Thus, the analog input signal Sa and the dither signal Si are quantized by the first and second Δ-Σ modulation type quantizers 10a and 10b. Both first and second quantized signals Sg1 and Sg2 output from the first and second Δ-Σ modulation type quantizers 10a and 10b are applied to the fifth adder 34.

Either of the first and second quantized signals Sg1 and Sg2 includes two quantized components, i.e., a main quantized component Sga relating to the analog input signal Sa and a sub quantized component Sgi relating to the dither signal Si. Main quantized components Sg1a and Sg2a in the first and second quantized signals Sg1 and Sg2 have the same phase with each other. Sub quantized components Sg1i and Sg2i in the first and second quantized signals Sg1 and Sg2 have the opposite phase with each other. Thus, the main quantized components Sg1a and Sg2a emphasize each other in the fifth adder 34, but the sub quantized components Sg1i and Sg2i cancel each other in the fifth adder 34. Therefore, a combined quantization signal Sg output from the fifth adder 34 comprises only the main quantized component Sga responding the analog input signal Sa. The quantization signal Sg is emphasized twice to the each of main quantized components Sg1a and Sg2a.

The quantization signal Sg is applied to the overflow prevention filter 38. The overflow prevention filter 38 de-emphasizes the quantization signal Sg to a half, so that the emphasis of a de-emphasized quantization signal Sgo output from the overflow prevention filter 38 agrees with the each of the main quantized components Sg1a and Sg2a.

The de-emphasized quantization signal Sgo is applied to the decimation filter 12. The thin-out decimation filter 12 decimations prescribed quantization data from the de-emphasized quantization signal Sgo under the control of the clock signal CK. Thus a digital signal Sh corresponding to the analog input signal Sa is obtained from the decimation filter 12 and then applied to an output circuit 26 coupled to the decimation filter 12.

The latter conventional Δ-Σ modulation A/D converter still has a drawback that the A/D converter requires at least two Δ-Σ modulation type quantizers. this Δ-Σ modulation A/D converter also has a drawback that the size of integrated circuit devices constituting the A/D converter thereon becomes large.

SUMMARY OF THE INVENTION

It is, therefore, an object of the present invention to provide a Δ-Σ modulation A/D converter which can carry out high accuracy A/D conversion by a relatively simple circuit construction.

Another object of the present invention to provide a Δ-Σ modulation A/D converter which can be formed in integrated circuit devices with relatively small size.

In order to achieve the above object, a Δ-Σ modulation A/D converter according to one aspect of the present invention includes a clock generator for generating a very high frequency clock signal, a dither signal generator responsive to the clock signal generator for generating a dither signal which is synchronized with the clock signal, an adder coupled to the dither signal generator for combining the analog input signal and the dither signal, a delta-sigma modulation type quantizer coupled to the adder for quantizing the analog input signal and the dither signal in response to the clock signal and a data decimation circuit responsive to the clock signal and coupled to the delta-sigma modulation type quantizer for decimating prescribed quantization data from the quantized signal and producing a digital signal corresponding to the analog input signal.

Additional objects and advantages of the present invention will be apparent to persons skilled in the art from astudy of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
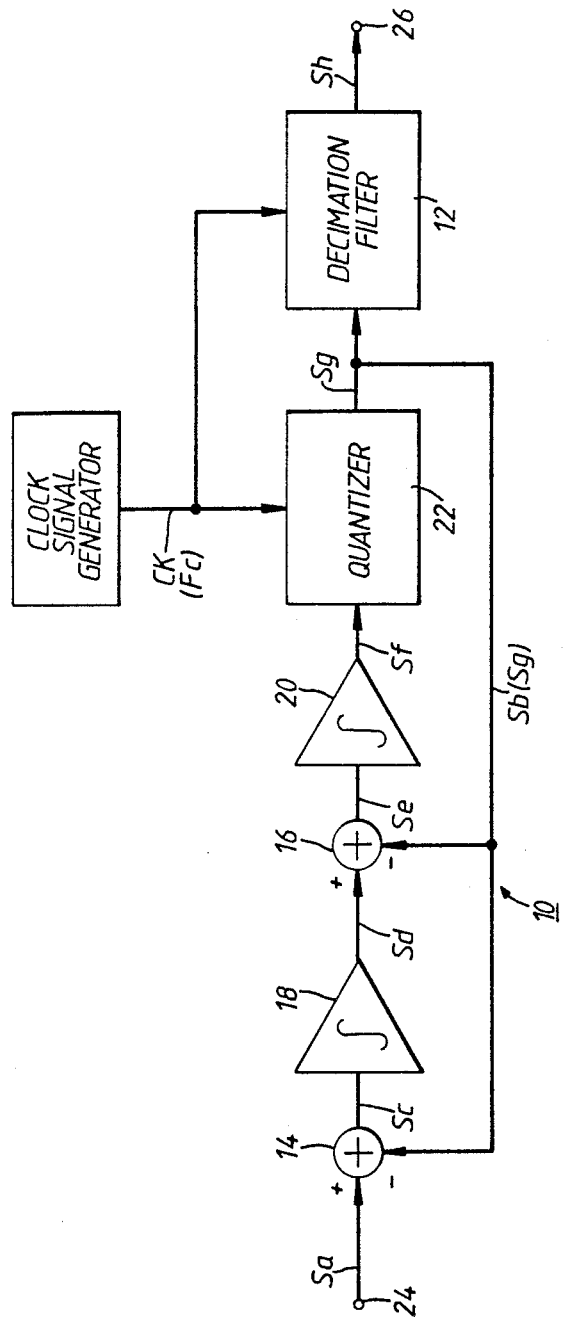
FIGS. 1 and 2 are block diagrams showing conventional Δ-Σ modulation A/D converters.

The present invention will be described in detail with reference to the FIGS. 3 through 4(c). In the following explanation of FIG. 3, reference numerals of letters used in FIGS. 1 and 2 will be used to designate like or equivalent elements for simplicity of explanation.

Figure 3:
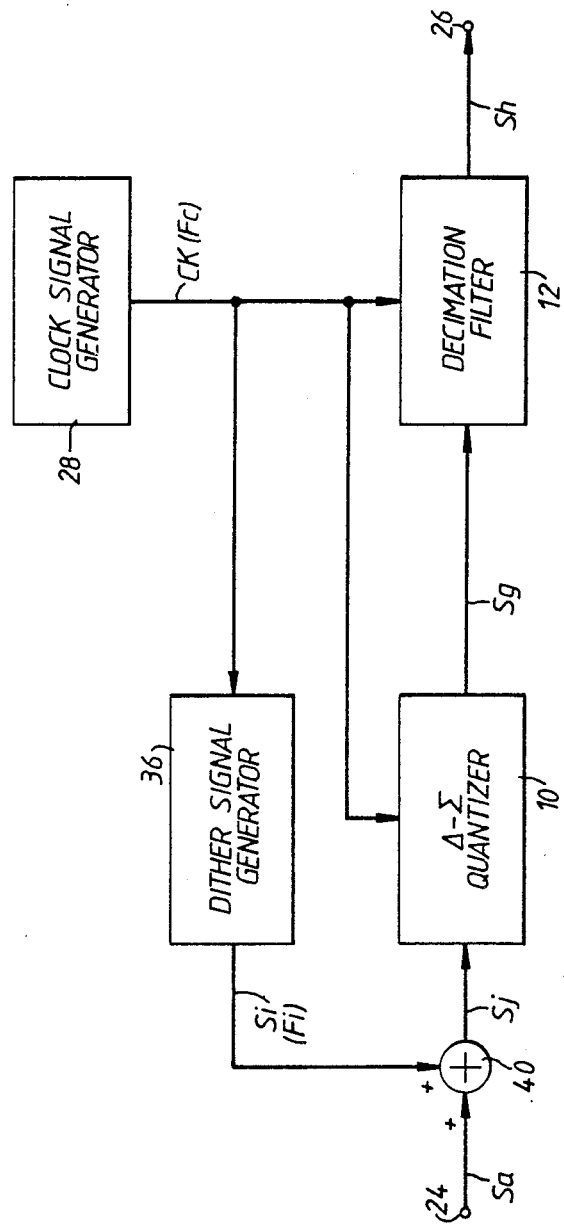
FIG. 3 is a block diagram showing an embodiment of a Δ-Σ modulation A/D converter according to the present invention.

Referring now to FIG. 3, an embodiment of the Δ-Σ type A/D converter according to the present invention will be described in detail.

As shown in FIG. 3, the embodiment of the Δ-Σ modulation A/D converter comprises an adder 40, a Δ-Σ modulation type quantizer 10, a decimation filter 12, a dither signal generator 36 and a clock signal generator 28. The Δ-Σ modulation type quantizer 10 has a typical construction, like the Δ-Σ modulation type quantizer 10 of FIG. 1. The clock signal generator 28 supplies a clock signal CK to the Δ-Σ modulation type quantizer 10, the decimation filter 12 and the dither signal generator 36.

The adder 40 is coupled to an input circuit 24 for receiving an analog input signal Sa to the digitalized. The adder 40 is further coupled to the dither signal generator 36 for receiving a dither signal Si, which will be described in detail later. Thus, the dither signal Si is combined with the analog input signal Sa in the adder 40. The analog input signal Sa and the dither signal Si are applied to the Δ-Σ modulation type quantizer 10 through the adder 40. Thus, the analog input signal Sa and the dither signal Si are quantized by the Δ-Σ modulation type quantizer 10. A quantized signal Sg output from the Δ-Σ modulation type quantizer 10 includes two quantized components, i.e., a main quantized component Sga relating to the analog input signal Sa and a sub quantized component Sgi relating to the dither signal Si. The quantized signal Sg obtained by the Δ-Σ modulation type quantizer 10 is applied to the decimation filter 12.

Figure 4A:
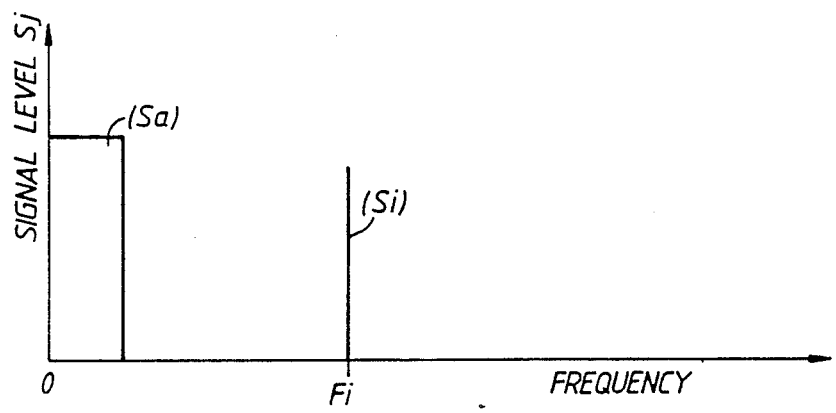
FIGS. 4(a), 4(b) and 4(c) are graphs for illustrating the operation of the Δ-Σ modulation A/D converter of FIG. 3.

The dither signal generator 36 is coupled to the clock signal generator 28 for receiving the clock signal CK, as described above. Thus, the dither signal generator 36 generates the dither signal Si which has a frequency Fi specified to one of integral multiples of the frequency Fc of the clock signal CK and a phase synchronized with the phase of the clock signal CK. The frequency Fi of the dither signal Si is represented by the following equation, in relation to the frequency Fc of the clock signal CK;

$$Fi = m \cdot Fc \tag{1}$$

where m is a positive integral, such as 1, 2, 3, . . . .

where the frequency Fi of the dither signal Si is equal to the frequency Fc of the clock signal CK (i.e., m=1), signal Sj output from the adder 40 has a frequency characteristic as shown in FIG. 4(a). In FIG. 4(a), the analog input signal Sa exists in spreading over an audio frequency band. The dither signal Si exists at the frequency Fc of the clock signal CK. Generally, the frequency Fi is set to have a frequency sufficiently higher than the highest frequency of the analog input signal Sa. Thus, the dither signal Si is separated from the frequency band of the analog input signal Sa by a wide frequency gap.

The Δ-Σ modulation type quantizer 10 quantizes the analog input signal Sa and the dither signal Si as they are by using the clock signal CK as the sampling signal. Thus, the quantized signal Sg output from the Δ-Σ modulation type quantizer 10 has a frequency characteristic equal to the frequency characteristic of the signal Sj output from the adder 40, i.e., the characteristic as shown in FIG. 4(a). Thus, the frequency characteristics of the analog input signal Sa and the dither signal Si in FIG. 4(a) correspond to those of the main quantized component Sga and the sub quantized component Sgi.

The quantized signal Sg is applied to the decimation filter 12 as described above. The thin-out decimation filter 12 carries out a data decimation operation under the control of the clock signal CK supplied from the clock signal generator 28. The decimation filter 12 has a signal transmission characteristic as shown in FIG. 4(b).

Figure 4B:
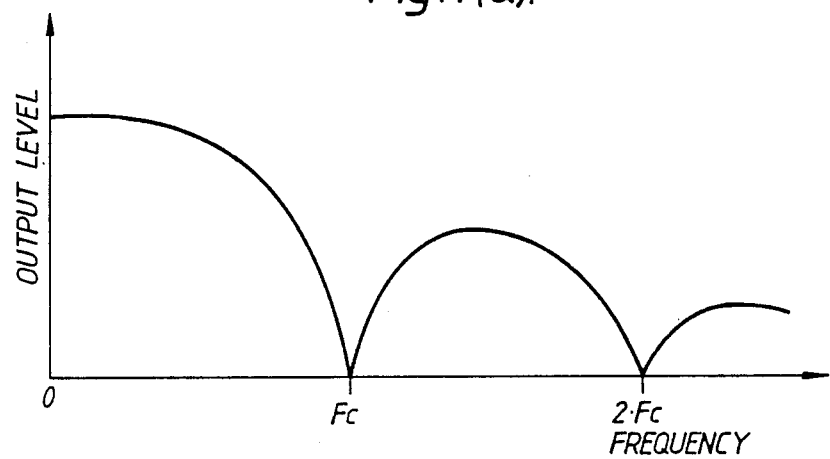
Figure 4C:
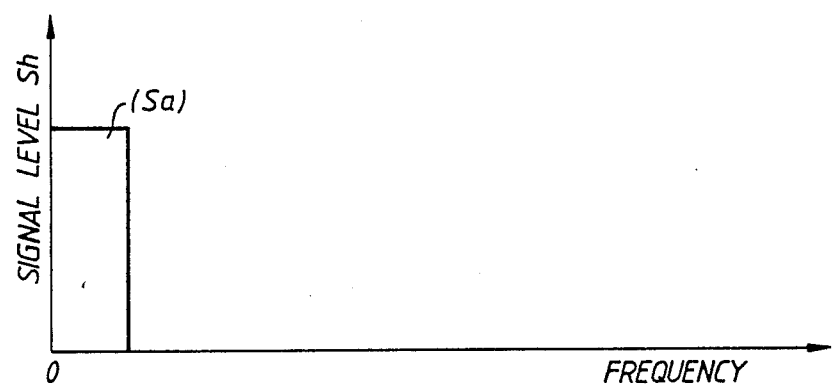

As shown in FIG. 4(b), the response of the signal output from the decimation filter 12 is reduced to zero at every distinct frequency equal to the integral multiples of the frequency Fc of the clock signal CK, e.g., at the frequencies of Fc, 2·Fc, . . . . The frequency Fi of the dither signal Si is set to the lowest distinct frequency, i.e., the frequency equal to the frequency Fc of the clock signal CK, as described above.

The sub quantized component Sgi in the quantized signal Sg has the frequency Fi of the dither signal Si. The frequency Fi agrees to the lowest distinct frequency, i.e., the frequency Fc of the clock signal CK, as described above. Thus, the sub quantized component Sgi is effectively eliminated in the decimation filter 12.

Accordingly, a signal Sh output from the decimation filter 12 includes data responding only the main quantized components Sga, but does not includes data responding the sub quantized components Sgi. The frequency characteristic of the signal Sh is illustrated in FIG. 4(c). This signal Sh is obtained through an output terminal 26 coupled to the decimation filter 12.

In the embodiment described above, the frequency Fi of the dither signal Si is set the frequency equal to the frequency Fc of the clock signal CK (i.e., m=1). However, it will be easily understood from the transmission characteristic, as shown in FIG. 4(b), that the frequency Fi can be selected from other integral multiples of the frequency Fc of the clock signal CK. Furthermore, waveform of the dither signal Si is not limited to a sinusoidal wave. It can also be a rectangular wave, a triangular wave, etc. Such a wave like the rectangular wave, the triangular wave, etc. includes a fundamental wave and its many harmonic components. The harmonic components, however, correspond to the integral multiples of the fundamental wave. Thus, quantized signals corresponding the fundamental wave as well as the harmonic components are eliminated in the decimation filter 12.

Figure 2:
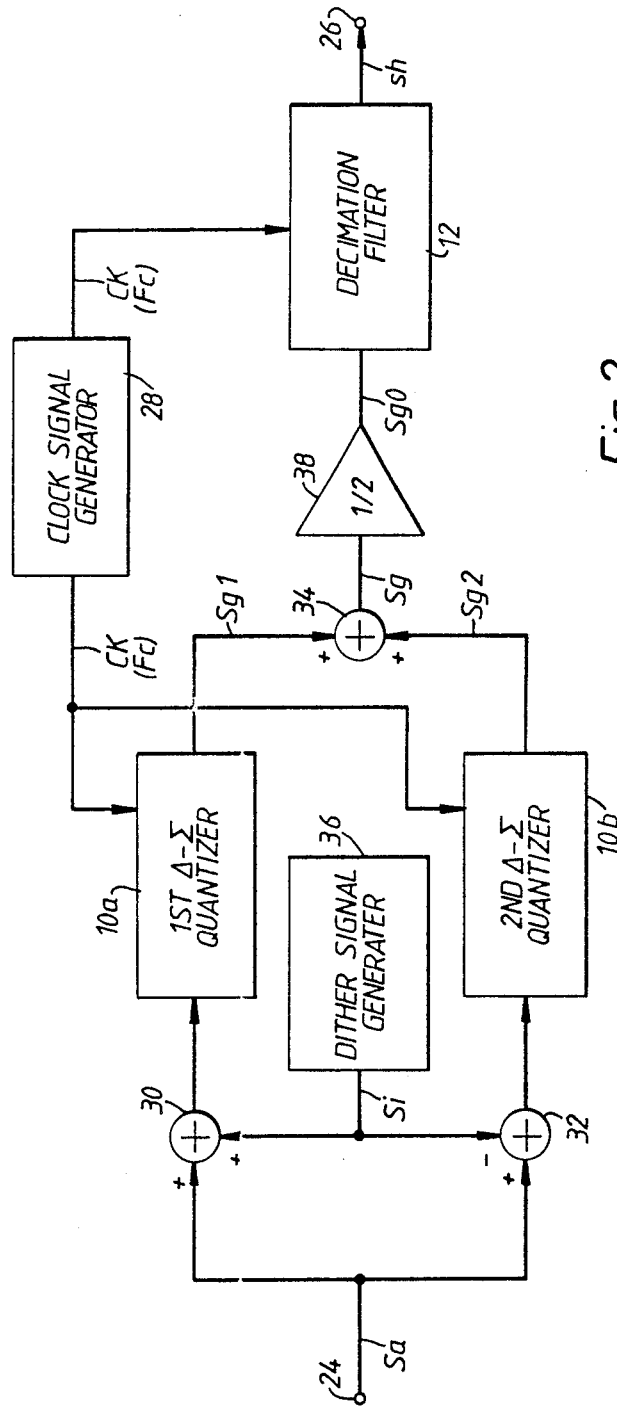

The Δ-Σ modulation type quantizer 10 has a double-integration quantizer configuration, like the typical Δ-Σ modulation type quantizer 10 in FIG. 1. However, the Δ-Σ modulation type quantizer 10 can be constructed in any other configuration, such as a single-integration quantizer configuration, a triple-integration quantizer configuration, etc. Generally, the transmission characteristics of n-order Δ-Σ modulation type quantizer is given by the following equation;

$$Y = X + (1 - Z^{-1})^n \cdot Q \tag{2}$$

where Y represents a quantized output, X represents an analog input, Z represents a transmission formula, n represent an integration order corresponding to integration stages, and Q represents a quantization noise. As seen from the equation (2), a quantization noise included in the quantization output Y is reduced further by increasing the integration stages n.

As described above, the present invention can provide as extremely preferable Δ-Σ modulation type A/D converter.

While there have been illustrated and described what are at present considered to the preferred embodiments of the present invention, it will be understood by those skilled in the art that various changes and modifications may be made, and equivalents may be substituted for elements thereof without departing from the true scop of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention but that the present invention include all embodiments falling within the scope of the appended claims.

What is claimed is:

1. A delta-sigma modulation analog to digital converter for converting an analog input signal to a digital output signal comprising:

clock generator means for generating a clock signal;

dither signal generator means, responsive to the clock signal generator means, for generating a dither signal synchronized with the clock signal;

adder means, coupled to the dither signal generator means, for combining the analog input signal and the dither signal, and outputting a combined signal;

delta-sigma modulation type quantization means, coupled to the adder means, for quantizing the combined signal in response to the clock signal, and outputting a quantized combined signal; and decimation circuit means, responsive to the clock signal and coupled to the delta-sigma modulation type quantization means, for substantially eliminating the dither signal from the quantized combined signal and producing a digital signal corresponding to the analog input signal.

2. The converter of claim 1 wherein the dither signal generator means includes means for generating a frequency of the dither signal which is related to the frequency of the clock signal.

3. The converter of claim 2 wherein the frequency generating means includes a multiplier circuit.

4. The converter of claim 2 wherein the dither signal generator means includes a sinusoidal wave generator.

5. The converter of claim 2 wherein the dither signal generator means includes a rectangular wave generator.

6. The converter of claim 2 wherein the dither signal generator means includes a triangular wave generator.

7. The converter of claim 1 wherein the dither signal generator means includes means for synchronizing the phase of the dither signal with the phase of the clock signal.

8. A delta-sigma modulation analog to digital converter for converting an analog input signal to a digital output signal comprising:

clock generator means for generating a clock signal;

dither signal generator means, responsive to the clock signal generator means, for generating a dither signal synchronized with the clock signal;

delta-sigma modulation type quantization means for quantizing the analog input signal and the dither signal in response to the clock signal; and decimation circuit means, responsive to the clock signal and coupled to the delta-sigma modulation type quantization means, for eliminating the quantized dither signal from the quantized analog signal and the quantized dither signal output from the delta-sigma modulation type quantization means and producing a digital signal corresponding to the analog input signal.

* * * * *

UNITED STATES PATENT AND TRADEMARK OFFICE
CERTIFICATE OF CORRECTION

PATENT NO. : 4,968,987
DATED : November 06, 1990
INVENTOR(S) : Hideyuki Naka et al.

It is certified that error appears in the above-identified patent and that said Letters Patent is hereby corrected as shown below:

In the Abstract, line 14, change "decimation" to --decimating--.

Column 1, line 49, change "inversed" to --inverse--.

Column 2, line 23, change ". the" to --. The--.

Column 2, line 30, change "thins out" to --decimates--.

Column 2, line 41, change "quantizint" to --quantizing--.

Column 3, line 16, change "ditcher" to --dither--.

Column 3, line 52, delete [thin out].

Column 3, line 53, change "decimations" to --decimates--.

Column 3, line 62, change "this" to --This--.

Column 4, line 24, change "astudy" to --a study--.

Column 5, line 28, change "where" to --Where--.

UNITED STATES PATENT AND TRADEMARK OFFICE
CERTIFICATE OF CORRECTION

PATENT NO. : 4,968,987

DATED : November 06, 1990

INVENTOR(S) : Hideyuki Naka et al.

It is certified that error appears in the above-identified patent and that said Letters Patent is hereby corrected as shown below:

Column 5, line 52, delete [thin-out].

Column 6, line 5, delete [,] and change "includes" to --include--.

Column 6, line 6, change "responding" to --corresponding to--.

Column 6, line 24, insert --to-- after "corresponding"

Column 6, line 47, change "as" to --an--.

Column 6, line 50, change "the" to --be--.

Column 6, line 54, change "scop" to --scope--.

UNITED STATES PATENT AND TRADEMARK OFFICE
CERTIFICATE OF CORRECTION

PATENT NO. : 4,968,987

DATED : November 6, 1990

INVENTOR(S) : Hideyuki Naka, et al.

It is certified that error appears in the above-identified patent and that said Letters Patent is hereby corrected as shown below:

Column 6, line 54, change "scop" to --scope--.

Signed and Sealed this

Thirteenth Day of April, 1993

Attest:

STEPHEN G. KUNIN

*Attesting Officer*   Acting Commissioner of Patents and Trademarks